(12) United States Patent
Starz et al.

(10) Patent No.: US 6,558,746 B2
(45) Date of Patent: May 6, 2003

(54) COATING COMPOSITION FOR PRODUCING ELECTRICALLY CONDUCTIVE COATINGS

(75) Inventors: Karl-Anton Starz, Rodenbach (DE); Willi Peter, Blankenbach (DE)

(73) Assignee: Ferro GmbH, Frankfurt (DE)

( * ) Notice: Subject to any disclaimer, the term of this patent is extended or adjusted under 35 U.S.C. 154(b) by 0 days.

(21) Appl. No.: 09/969,036

(22) Filed: Oct. 3, 2001

(65) Prior Publication Data

US 2002/0037369 A1 Mar. 28, 2002

Related U.S. Application Data

(63) Continuation-in-part of application No. 09/281,321, filed on Mar. 30, 1999, now abandoned.

(30) Foreign Application Priority Data

Apr. 6, 1998 (DE) .......................................... 198 15 291

(51) Int. Cl.$^7$ ................................................. B05D 3/02
(52) U.S. Cl. ........................ 427/387; 252/512; 252/514; 252/519.33; 252/520.1; 252/521.1; 523/205; 524/439; 524/440; 524/806; 524/832
(58) Field of Search ................................ 252/512, 514, 252/519.33, 519.34, 520.1, 521.1; 523/205; 524/439, 440, 806, 832

(56) References Cited

U.S. PATENT DOCUMENTS

| 3,814,716 A | 6/1974 | Kowalski et al. ........... 524/806 |
| 5,240,992 A | 8/1993 | Yamaya ....................... 524/806 |

FOREIGN PATENT DOCUMENTS

| DE | 4431723 | 3/1995 |
| EP | 0835913 | 4/1998 |
| JP | 06346006 | 12/1994 |

OTHER PUBLICATIONS

Patent Abstracts of Japan vol. 012, No. 279 (C–517), Aug. 1, 1988, JP 63 057676, Mar. 12, 1988.

*Primary Examiner*—Margaret G. Moore
*Assistant Examiner*—Christopher M Keehan
(74) *Attorney, Agent, or Firm*—Rankin, Hill, Porter & Clark LLP

(57) ABSTRACT

A coating composition for producing electrically conductive coatings, containing one or more electrically conductive pigments and an organic binder, as well as, optionally, additives and auxiliary agents, in an aqueous solvent, which organic binder contains a copolymer dispersible in water and based on (meth)acrylate- and silylated, unsaturated monomers. The total content of organic solvents in the composition does not exceed 0.5% by weight. The coatings thus obtained are especially well-bonded and resistant to mechanical influences and to solvents, and exhibit suitable conductivity (sheet resistivity) values.

28 Claims, No Drawings

COATING COMPOSITION FOR PRODUCING ELECTRICALLY CONDUCTIVE COATINGS

CROSS-REFERENCE TO RELATED APPLICATIONS

This application is a continuation-in-part application of U.S. patent application Ser. No. 09/281,321, filed Mar. 30, 1999 now abandoned, which is incorporated herein by reference in its entirety.

FIELD OF THE INVENTION

This invention relates to coating compositions for the production of electrically conductive coatings on electrically nonconductive substrates, such as, e.g., glass, ceramic materials, or plastic.

BACKGROUND OF THE INVENTION

"Conductive lacquers" are used, e.g., for coatings intended for the electromagnetic shielding (EMI screening) of electronic devices such as personal computers and portable telephones. The lacquers are applied, for this purpose, to the appropriate plastic housing by spraying or immersion, and then subsequently dried in ambient air or in an oven in order to remove volatile components. Other uses for such lacquers are in the production of printed circuit boards and in the metallizing of wax cores for electroforming processes.

Compositions for these applications customarily contain fine metallic powders, as well as, optionally, non-metallic powders, which are dispersed in a binder-solvent system.

Conventional conductive lacquers ordinarily contain large amounts of volatile organic solvents such as ethylene glycol, butyl acetate, ethyl glycol acetate, etc. These solvents are, as a rule, dangerous to workers' health and to the environment. The maximum concentration of these components in the workplace is therefore limited. Special protective devices such as outlets, suction removal systems, filter systems and solvent recovery systems must be used in the processing and drying of the lacquers, as well as when cleaning the containers and devices used. If readily combustible solvents are involved, additional measures for protection against explosions are required.

Recent attempts have been made to replace such organic solvents with water, in order to minimize the danger to the health of workers and to reduce the strain on the environment.

DE 44 31 723 C2 describes metallizing pastes for the coating of inorganic substrates by silk-screen (sieve screen) pressure, and also by spraying and immersion. The aqueous dispersions used therein are produced with rheological auxiliary agents and contain no organic binder. These compositions therefore exhibit no chemical cross-linking during drying. Accordingly, the conductive coatings produced do not have sufficient adhesive strength and resistance to wear and to moisture. Therefore, they cannot be used for shielding purposes.

U.S. Pat. No. 5,492,653 also describes coating compositions which can be processed in the spraying method. These lacquers contain silver flake powder coated with organic carboxylic acids, and also contain a significant amount (up to 8% by weight) of organic solvents. Solvents such as, e.g., diethylene glycol monobutyl ether are used therein, which solvents are also harmful from a toxic standpoint.

SUMMARY OF THE INVENTION

Surprisingly, it has been discovered that the above requirements are met by a coating composition containing one or more conductive pigments and an organic binder, as well as, if necessary, additives and auxiliary agents, in an aqueous solvent, which organic binder is a copolymer dispersible in water and based on (meth)acrylate- and silylated, unsaturated monomers. The total content of organic solvents in the composition does not exceed 0.5% by weight.

Thus, the subject matter of the invention is a coating composition, characterized as above, for producing electrically conductive coatings.

DETAILED DESCRIPTION OF THE INVENTION

It turns out that when such partially silylated (meth) acrylate copolymers are used as a binder in conductive coating compositions with components which are otherwise customary for this purpose, but with water as solvent, conductive coatings with excellent adhesive strength, mechanical resistance and resistance to solvents can be obtained. These qualities are thought to result from a cross-linking of silanol groups which are formed from the silyl groups contained in the copolymer. Very well-bonded, conductive lacquer coatings resistant to solvents and mechanical influence are obtained by the formation of a polysiloxane network, in addition to the film formation which takes place by the flowing of the polymer resin dispersed in the composition during the drying and hardening.

The silylated copolymer to be used in accordance with the invention as a binder consists of a basic framework of acrylate units or methacrylate units and/or vinylic monomer units, some of which carry silyl groups. A suitable silyl functioning is brought about with trialkoxysilyl groups such as, in particular, trimethoxy- and triethoxysilyl groups. The latter are readily transformed by hydrolysis into silanol groups (—Si—OH) which can be united to a polysiloxane network (—O—Si—O—Si—O—).

Typical silylated co-monomers are, e.g., methacryloxypropyl trimethoxysilane and vinyl trimethoxysilane.

The copolymer purposefully has a degree of silylation of 0.05 to 50%. Such copolymers are readily dispersible in water, during which organic (co)solvents can be eliminated.

A typical copolymer is composed, e.g., of 45% methylmethacrylate, 50% n-butylacrylate and 5% methacryloxypropyltrimethoxysilane, and has a residual monomer content of the particular monomers of less than 0.5% by weight.

The copolymer functioning as a binder is purposefully used in the conductive coating composition of the invention in the form of an aqueous dispersion. Such an aqueous polymer dispersion has a solid content of 25 to 75% by weight, preferably 25 to 50% by weight, more preferably 30 to 40% by weight. Such aqueous polymer dispersions are self-cross-linking; their minimum film formation temperature (MFT) can be adjusted as desired in accordance with the composition. Appropriate polymer dispersions are commercially available (e.g. SD 194, Degussa-Hüls AG; SANMOL SW 131, SW 135, Sanyo Chemicals). Surprisingly, the use of these special, silylated acrylate copolymer dispersions also assures a better settling behavior in comparison to products containing solvents. This results in simple processing of the lacquer during spraying, brushing or immersion.

The coating compositions in accordance with the invention contain conductive pigments as well as, optionally, other additives and/or auxiliary agents. Preferably, silver flake powders (e.g., F14, D21, D12 or D35, Degussa-Hüls AG) or copper flake powders (e.g., type MP 6100, Eckart- Werke) can be used as conductive pigments. Even metallized, inorganic, flake pigments (e.g., EMI pigment TP1029A, Cerdec AG) can be used. In addition, powders of conductive, inorganic oxides such as, e.g., fluoride-doped stannous oxide $SnO_2$ (F) or indium/stannous oxide $In_2O_3/SnO_2$ can be used.

In particular, wetting agents, defoaming agents, thixotroping agents, adhesion promoters and cross-linking agents can be used as lacquer additives. Combinations of various defoaming-agent types and wetting-agent types can also be used (e.g., Dehydran 1227, Dehydran 1293G, Dehydran 1513 or Dehydran 1620 (Henkel KGaA, Dusseldorf). Examples of thixotroping agents are pyrogenic silicas (Aerosil®, Degussa-Hüls AG). Examples of adhesion promoters and cross-linking agents are epoxysilanes (e.g., silane A174, Union Carbide company).

The conductive lacquer of the invention typically has the following composition:

- 2.5 to 10% by weight silylated copolymer
- 25 to 75% by weight conductive pigment
- 13 to 72.5% by weight water
- 0 to 3% by weight lacquer additives (defoaming agents, wetting agents, thixotroping agents, adhesion promoters, cross-linking agents)
- 0 to 0.5% by weight organic solvent.

Since the copolymer is used in the form of a purely aqueous dispersion, and since only water is used as the solvent, the amount of volatile organic solvents in the lacquer of the invention is determined by the amount of the lacquer additives (defoaming agents, wetting agents, etc.) in the recipe. When defoaming agents with a low solvent content are used (less than 40%), the amount of organic solvent in the conductive lacquer can be adjusted to less than 0.5% by weight relative to the entire recipe. When defoaming agents on a completely aqueous basis are used (e.g., Dehydran 1620), a completely aqueous lacquer system is obtained without any amount of organic solvents.

During the processing of such products, the dangers to the health of the workers, as well as the strain on the environment, are minimized, since only very slight amounts of organic solvents are released. Also, water can be used to dilute the lacquer of the invention. Residues of the lacquer on faultily coated parts can therefore be removed with water, and the tools for working the lacquer can be cleaned with water. Since the polymer resin itself poses no great danger, the water of the aqueous cleaning solutions also poses no great problems.

The coating compositions according to the claimed invention are used, for example, as coatings for the electromagnetic shielding (EMI screening) of electronic devices such as personal computers and portable telephones. The lacquers are applied, for this purpose, to the appropriate plastic housing by spraying or immersion, and then subsequently dried in ambient air or in an oven in order to remove volatile components. The lacquer is sprayed onto the inside of a housing of a mobile telephone, or the like, the spray time being selected so that a coating thickness of 10 μm is achieved after drying. The coatings obtained are resistant to wiping, scratching and moisture.

The coatings according to the claimed invention exhibit an electrical conductivity (sheet resistivity) which is in the range of 0.01 to 100 Ohms/square, preferably from 10–100 mOhm/square, more preferably from 25–75 mOhm/square, for example in the range of 35–50 mOhm/square, relative to a lacquer-coating thickness of 10 μm. (The conductivity values are given as sheet resistivity values in Ohms/square, with reference to a coating thickness of 10 microns. The cited values are determined according to techniques well known in the art, according to conventional testing standards.) The amount of volatile organic solvents in such lacquers is less than 0.5% by weight relative to the total recipe. Other uses for such lacquers are in the production of printed circuit boards, and in the metallizing of wax cores for electroforming processes, where equally satisfactory results are obtained.

EXAMPLES

The following examples are intended to explain in detail the properties of the lacquer in accordance with the invention (all percentage data is in % by weight):

Example 1

The following components are mixed in a container according to the following recipe and subsequently dispersed with a suitable agitator:

| | |
|---|---|
| 50.0% | silver flake powder (D12, Degussa-Hüls AG, Hanau) |
| 8.4% | silylated copolymer (type SW 135, Sanyo company, Japan) |
| 1.2% | defoaming agent (Dehydran 1227, Henkel KGaA company) |
| 40.4% | water |
| 100.0%. | |

This lacquer is sprayed onto the inside of a housing of a mobile telephone. The spray time is selected so that a coating thickness of 10 μm is achieved after drying. After drying at 60° C., coatings are obtained which are resistant to wiping, scratching and moisture. The electrical conductivity of the coatings is 45 mOhm/square relative to a lacquer-coating thickness of 10 μm. The adhesive-strength test (adhesive-film test) is passed. The amount of volatile organic solvents in this lacquer is less than 0.5% by weight relative to the total recipe.

Example 2

The following lacquer components are weighed in and then dispersed:

| | |
|---|---|
| 50.0% | silver flake powder (F14, Degussa-Hüls AG, Hanau) |
| 7.4% | silylated copolymer (Type SW 131, Sanyo company, Japan) |
| 1.5% | defoaming agent (Dehydran 1620, Henkel KGaA company) |
| 0.5% | pyrogenic silica (Aerosil 200, Degussa-Hüls AG) |
| 40.4% | water |
| 100.0% | |

This lacquer is sprayed onto the inside of a computer housing of a laptop computer. There was no running of the lacquer down the sides in the wet state, and in particular, no formation of noses (nibs) or drips. Coatings which are resistant to wiping, scratching and moisture are obtained after drying at room temperature or at 60° C. The electrical conductivity of the coatings is 40 mOhm/square at a coating thickness of 10 μm. The EMI screening properties of the material are quite good. The lacquer contains no volatile organic solvents which can be released during drying since a completely aqueous system is used as the defoaming agent.

Example 3

| | |
|---|---|
| 50.0% | silver flake powder (D12, Degussa-Hüls AG, Hanau) |
| 8.4% | silylated copolymer (type SD 194, Degussa-Hüls AG, Hanau) |
| 2.0% | defoaming agent (Dehydran 1227, Henkel KGaA company) |
| 0.8% | adhesion promoter (silane A174, Union Carbide company) |
| 100.0% | |

This lacquer is brushed onto polyester foils of the type MYLAR A (DuPont). It shows no running from the substrates, and the contour stability is quite good. Conductive strip conductors resistant to wiping and moisture are obtained after drying at 60° C. The amount of volatile organic solvents in this lacquer is less than 0.5% by weight relative to the total recipe.

Example 4

The following components are weighed in and dispersed:

| | |
|---|---|
| 50.0% | copper flake powder (MP 6100, Eckart-Werke company, Furth) |
| 8.4% | silylated copolymer (type SANMOL SW 131, Sanyo company, Japan, |
| 2.0% | defoaming agent (Dehydran 1620, Henkel KGaA company), |
| 39.6% | water |
| 100.0% | |

This lacquer is brushed onto polyester foils of the type MYLAR L (DuPont). It shows no running from the substrates, and the contour stability is quite good. After drying at 60° C., strip conductors resistant to wiping, scratching and moisture are obtained. The lacquer contains no volatile organic solvents which can be released during drying, since a completely aqueous defoaming-agent system is used.

Example 5

| | |
|---|---|
| 50.0% | iron oxide, silvered (EMI pigment TP 1029A, Cerdec AG) |
| 8.4% | silylated copolymer (type SANMOL SW 131) |
| 1.2% | defoaming agent (Dehydran 1227, Henkel KGaA company) |
| 39.6% | water |
| 100.0% | |

This lacquer is sprayed onto a ceramic substrate. After drying at 60° C., coatings are obtained which are resistant to wiping, scratching and moisture. The electric conductivity of the coatings is quite good. The amount of volatile organic solvents released during drying is less than 0.5%.

Example 6

The following components are weighed in and dispersed:

| | |
|---|---|
| 25.0% | conductive stannous oxide $SnO_2$ (F) (Goldschmidt company, Essen) |
| 10.0% | silylated copolymer (SANMOL SW 130) |
| 1.2% | defoaming agent (Dehydran 1620, Henkel KGaA company) |
| 63.8% | water |
| 100.0% | |

The lacquer is sprayed onto ceramic plates, which yields coatings with good conductivity after drying at room temperature. The amount of organic solvent is 0%.

Further variations and modifications will be apparent to those skilled in the art from the foregoing, and are intended to be encompassed by the claims appended hereto.

German priority application 198 15 291.4 is relied upon and incorporated herein by reference in its entirety.

We claim:

1. A coating composition for producing electrically conductive coatings, comprising:
    at least one electrically conductive pigment, present and in an amount of from 25 to 75% by weight;
    an organic binder, which is a copolymer dispersible in water and made from a (meth)acrylate monomer and a silylated unsaturated monomer; and,
    an effective amount of water as a solvent,
    wherein the coating composition has a total content of organic solvent in the composition not exceeding 0.5% by weight, and
    wherein the coating composition, when applied to an electrically nonconductive substrate to produce an electrically conductive coating, results in a coating which exhibits an electrical conductivity (sheet resistivity) in the range of from 0.01 to 100 Ohms/square, relative to a lacquer-coating thickness of 10 μm.

2. The coating composition according to claim 1, wherein the copolymer has a degree of silylation of 0.05 to 50%.

3. The coating composition according to claim 1, wherein the organic binder comprises an aqueous dispersion of the copolymer with a solid content of 25 to 50% by weight.

4. The coating composition according to claim 1, wherein the organic binder comprises an aqueous dispersion of the copolymer with a solid content of 30 to 40% by weight.

5. The coating composition according to claim 2, wherein the organic binder comprises an aqueous dispersion of the copolymer with a solid content of 25 to 50% by weight.

6. The coating composition according to claim 2, wherein the organic binder comprises an aqueous dispersion of the copolymer with a solid content of 30 to 40% by weight.

7. The coating composition according to claim 1, wherein the electrically conductive pigment is selected from the group consisting of silver, copper, metallized, or conductive inorganic pigments, and combinations thereof.

8. The coating composition according to claim 2, wherein the electrically conductive pigment is selected from the group consisting of silver, copper, metallized, or conductive inorganic pigments, and combinations thereof.

9. The coating composition according to claim 3, wherein the electrically conductive pigment is selected from the group consisting of silver, copper, metallized, or conductive inorganic pigments, and combinations thereof.

10. The coating composition according to claim 9, wherein said conductive inorganic pigment is a member selected from the group consisting of fluoride-doped stannous oxide, indium stannous oxide, and silvered iron oxide.

11. The coating composition according to claim 1, wherein the coating composition, when applied to an electrically nonconductive substrate to produce an electrically conductive coating, results in a coating which exhibits an electrical conductivity (sheet resistivity) in the range of from 10–100 mOhms/square, relative to a lacquer-coating thickness of 10 μm.

12. The coating composition according to claim 1, wherein the coating composition, when applied to an electrically nonconductive substrate to produce an electrically conductive coating, results in a coating which exhibits an electrical conductivity (sheet resistivity) in the range of from 25–75 mOhms/square, relative to a lacquer-coating thickness of 10 μm.

13. The coating composition according to claim 1, wherein the coating composition, when applied to an electrically nonconductive substrate to produce an electrically conductive coating, results in a coating which exhibits an electrical conductivity (sheet resistivity) in the range of from 35–50 mOhms/square, relative to a lacquer-coating thickness of 10 µm.

14. A coating composition for producing electrically conductive coatings, comprising:
   2.5 to 10% by weight of a silylated copolymer;
   25 to 75% by weight of an electrically conductive pigment;
   13 to 72.5% by weight water; and
   0 to 3% by weight lacquer additives and/or auxiliary agents,
   wherein the composition contains from 0 to 0.5% by weight organic solvent, and
   wherein the coating composition, when applied to an electrically nonconductive substrate to produce an electrically conductive coating, results in a coating which exhibits an electrical conductivity (sheet resistivity) in the range of from 0.01 to 100 ohms/square, relative to a lacquer-coating thickness of 10 µm.

15. A method for producing an electrically conductive coating on an electrically nonconductive substrate, comprising:
   mixing and dispersing a coating composition comprising:
      at least one electrically conductive pigment, present and in an amount of from 25 to 75% by weight;
      an organic binder, which is a copolymer dispersible in water and made from a (meth)acrylate monomer and a silylated unsaturated monomer; and,
      an effective amount of water as a solvent,
      wherein the coating composition has a total content of organic solvent in the composition not exceeding 0.5% by weight; and
   applying the coating to the electrically nonconductive substrate, using a method of application selected from the group consisting of spraying, brushing, and immersing, to produce a coating which exhibits an electrical conductivity (sheet resistivity) in the range of from 0.01 to 100 Ohms/square, relative to a lacquer-coating thickness of 10 µm.

16. A method for producing an electrically conductive coating on an electrically nonconductive substrate, comprising:
   mixing and dispersing with a suitable agitator a coating composition comprising:
      2.5 to 10% by weight silylated copolymer;
      25 to 75% by weight of an electrically conductive pigment;
      13 to 72.5% by weight water;
      0 to 3% by weight lacquer additives and/or auxiliary agents; and,
      0 to 0.5% by weight organic solvents; and then,
   applying the coating to the electrically nonconductive substrate, using a method of application selected from the group consisting of: spraying, brushing, and immersing, to produce a coating which exhibits an electrical conductivity (sheet resistivity) in the range of from 0.01 to 100 Ohms/square, relative to a lacquer-coating thickness of 10 µm.

17. The method according to claim 15, wherein the method further comprises, following the step of applying the coating to the electrically nonconductive substrate,drying the coated substrate at a temperature of from 20 to 150° C.

18. The method according to claim 16, wherein the method further comprises, following the step of applying the coating to the electrically nonconductive substrate,drying the coated substrate at a temperature of from 20 to 150° C.

19. A method for producing a coating on an electrically nonconductive substrate, for electromagnetic screening, comprising:
   mixing and dispersing, with a suitable agitator, a coating composition comprising:
      at least one electrically conductive pigment, present an in an amount of from 25 to 75% by weight;
      an organic binder, which is a copolymer dispersible in water and made from a (meth)acrylate monomer and a silylated unsaturated monomer; and,
      an effective amount of water as a solvent,
      wherein the coating composition has a total content of organic solvent in the composition not exceeding 0.5% by weight; and
   applying the coating to the electrically nonconductive substrate, using a method of application selected from the group consisting of spraying, brushing, and immersing, to produce a coating which exhibits an electrical conductivity (sheet resistivity) in the range of from 0.01 to 100 Ohms/square, relative to a lacquer-coating thickness of 10 µm.

20. The coating composition according to claim 1, wherein the silylated, unsaturated monomer is selected from the group consisting of acrylate units, methacrylate units and vinylic monomer units.

21. The coating composition according to claim 20, wherein the silylated unsaturated monomer comprises trialkoxysilyl groups.

22. The coating composition according to claim 21, wherein the trialkoxysilyl groups are selected from trimethoxysilyl groups and triethoxysilyl groups.

23. The coating composition according to claim 1, wherein the silylated unsaturated monomer is selected from the group consisting of methacryloxypropyl trimethoxysilane and vinyl trimethoxysilane.

24. A coating composition for producing electrically conductive coatings, comprising:
   at least one electrically conductive pigment, present and in an amount of from 25 to 75% by weight;
   an organic binder, comprising a copolymer dispersible in water comprised of 45% methylmethacrylate, 50% n-butylacrylate and 5% methacryloxypropyltrimethoxysilane, and having a residual monomer content of less than 0.5% by weight; and
   an effective amount of water as a solvent,
   wherein the coating composition has a total content of organic solvent in the composition not exceeding 0.5% by weight, and
   wherein the coating composition, when applied to an electrically nonconductive substrate to produce an electrically conductive coating, results in a coating which exhibits an electrical conductivity (sheet resistivity) in the range of from 0.01 to 100 ohms/square, relative to a lacquer-coating thickness of 10 µm.

25. The coating composition according to claim 1, wherein the composition comprises an aqueous lacquer system obtained without an organic solvent.

26. The coating composition according to claim 14, wherein the composition comprises an aqueous lacquer system obtained without an organic solvent.

27. The coating composition according to claim 1, wherein the composition contains no volatile organic solvents which can be released during drying.

28. The coating composition according to claim 14, wherein the composition contains no volatile organic solvents which can be released during drying.

* * * * *